United States Patent
Lai et al.

(10) Patent No.: US 8,080,440 B2
(45) Date of Patent: Dec. 20, 2011

(54) RESISTOR RANDOM ACCESS MEMORY CELL WITH L-SHAPED ELECTRODE

(75) Inventors: Erh-Kun Lai, Elmsford, NY (US); ChiaHua Ho, Kaohsiung (TW); Kuang Yeu Hsieh, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 12/769,466

(22) Filed: Apr. 28, 2010

(65) Prior Publication Data

US 2010/0207095 A1      Aug. 19, 2010

Related U.S. Application Data

(62) Division of application No. 11/421,036, filed on May 30, 2006, now Pat. No. 7,732,800.

(51) Int. Cl.
*H01L 21/00* (2006.01)

(52) U.S. Cl. . 438/95; 257/4; 257/E21.61; 257/E45.002; 257/E21.003

(58) Field of Classification Search ................ 438/3, 95, 438/210, 238, 382, 910; 257/4, 555, 574, 257/E21.61, E27.004, E45.002, E21.003
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,599,705 A | 7/1986 | Holmberg et al. | |
| 4,719,594 A | 1/1988 | Young et al. | |
| 4,876,220 A | 10/1989 | Mohsen et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,389,566 A | 2/1995 | Lage | |
| 5,534,712 A | 7/1996 | Ovshinsky et al. | |
| 5,687,112 A | 11/1997 | Ovshinsky | |
| 5,751,012 A | 5/1998 | Wolstenholme et al. | |
| 5,789,277 A | 8/1998 | Zahorik et al. | |

(Continued)

FOREIGN PATENT DOCUMENTS

WO      0079539 A1      12/2000

(Continued)

OTHER PUBLICATIONS

Adler, D. et al., "Threshold Switching in Chalcogenide-Glass Thin Films," J. Appl/Phys 51(6), Jun. 1980, pp. 3289-3309.

(Continued)

*Primary Examiner* — Matthew W Such
*Assistant Examiner* — Monica D Harrison
(74) *Attorney, Agent, or Firm* — Haynes Beffel & Wolfeld LLP

(57) ABSTRACT

A phase change random access memory PCRAM device is described suitable for use in large-scale integrated circuits. An exemplary memory device has a pipe-shaped first electrode formed from a first electrode layer on a sidewall of a sidewall support structure. A sidewall spacer insulating member is formed from a first oxide layer and a second, "L-shaped," electrode is formed on the insulating member. An electrical contact is connected to the horizontal portion of the second electrode. A bridge of memory material extends from a top surface of the first electrode to a top surface of the second electrode across a top surface of the sidewall spacer insulating member.

17 Claims, 11 Drawing Sheets

U.S. PATENT DOCUMENTS

| | | | |
|---|---|---|---|
| 5,789,758 | A | 8/1998 | Reinberg |
| 5,814,527 | A | 9/1998 | Wolstenholme et al. |
| 5,831,276 | A | 11/1998 | Gonzalez et al. |
| 5,837,564 | A | 11/1998 | Sandhu et al. |
| 5,869,843 | A | 2/1999 | Harshfield |
| 5,879,955 | A | 3/1999 | Gonzalez et al. |
| 5,920,788 | A | 7/1999 | Reinberg |
| 5,952,671 | A | 9/1999 | Reinberg et al. |
| 5,970,336 | A | 10/1999 | Wolstenholme et al. |
| 5,985,698 | A | 11/1999 | Gonzalez et al. |
| 5,998,244 | A | 12/1999 | Wolstenholme et al. |
| 6,011,725 | A | 1/2000 | Eitan |
| 6,025,220 | A | 2/2000 | Sandhu |
| 6,031,287 | A | 2/2000 | Harshfield |
| 6,034,882 | A | 3/2000 | Johnson et al. |
| 6,077,729 | A | 6/2000 | Harshfield |
| 6,087,674 | A | 7/2000 | Ovshinsky et al. |
| 6,104,038 | A | 8/2000 | Gonzalez et al. |
| 6,111,264 | A | 8/2000 | Wolstenholme et al. |
| 6,114,713 | A | 9/2000 | Zahorik |
| 6,117,720 | A | 9/2000 | Harshfield |
| 6,147,395 | A | 11/2000 | Gilgen |
| 6,150,253 | A | 11/2000 | Doan et al. |
| 6,153,890 | A | 11/2000 | Wolstenholme et al. |
| 6,177,317 | B1 | 1/2001 | Huang et al. |
| 6,185,122 | B1 | 2/2001 | Johnson et al. |
| 6,189,582 | B1 | 2/2001 | Reinberg et al. |
| 6,236,059 | B1 | 5/2001 | Wolstenholme et al. |
| RE37,259 | E | 7/2001 | Ovshinsky |
| 6,271,090 | B1 | 8/2001 | Huang et al. |
| 6,280,684 | B1 | 8/2001 | Yamada et al. |
| 6,287,887 | B1 | 9/2001 | Gilgen |
| 6,314,014 | B1 | 11/2001 | Lowrey et al. |
| 6,320,786 | B1 | 11/2001 | Chang et al. |
| 6,339,544 | B1 | 1/2002 | Chiang et al. |
| 6,351,406 | B1 | 2/2002 | Johnson et al. |
| 6,420,215 | B1 | 7/2002 | Knall et al. |
| 6,420,216 | B1 | 7/2002 | Clevenger et al. |
| 6,420,725 | B1 | 7/2002 | Harshfield |
| 6,423,621 | B2 | 7/2002 | Doan et al. |
| 6,429,064 | B1 | 8/2002 | Wicker |
| 6,462,353 | B1 | 10/2002 | Gilgen |
| 6,483,736 | B2 | 11/2002 | Johnson et al. |
| 6,487,114 | B2 | 11/2002 | Jong et al. |
| 6,501,111 | B1 | 12/2002 | Lowrey |
| 6,507,061 | B1 | 1/2003 | Hudgens et al. |
| 6,511,867 | B2 | 1/2003 | Lowrey et al. |
| 6,512,241 | B1 | 1/2003 | Lai |
| 6,514,788 | B2 | 2/2003 | Quinn |
| 6,534,781 | B2 | 3/2003 | Dennison |
| 6,545,903 | B1 | 4/2003 | Wu |
| 6,555,858 | B1 | 4/2003 | Jones et al. |
| 6,555,860 | B2 | 4/2003 | Lowrey et al. |
| 6,563,156 | B2 | 5/2003 | Harshfield |
| 6,566,700 | B2 | 5/2003 | Xu |
| 6,567,293 | B1 | 5/2003 | Lowrey et al. |
| 6,579,760 | B1 | 6/2003 | Lung |
| 6,586,761 | B2 | 7/2003 | Lowrey |
| 6,589,714 | B2 | 7/2003 | Maimon et al. |
| 6,593,176 | B2 | 7/2003 | Dennison |
| 6,597,009 | B2 | 7/2003 | Wicker |
| 6,605,527 | B2 | 8/2003 | Dennison et al. |
| 6,605,821 | B1 | 8/2003 | Lee et al. |
| 6,607,974 | B2 | 8/2003 | Harshfield |
| 6,613,604 | B2 | 9/2003 | Maimon et al. |
| 6,617,192 | B1 | 9/2003 | Lowrey et al. |
| 6,621,095 | B2 | 9/2003 | Chiang et al. |
| 6,627,530 | B2 | 9/2003 | Li et al. |
| 6,639,849 | B2 | 10/2003 | Takahashi et al. |
| 6,673,700 | B2 | 1/2004 | Dennison et al. |
| 6,744,088 | B1 | 6/2004 | Dennison |
| 6,791,102 | B2 | 9/2004 | Johnson et al. |
| 6,797,979 | B2 | 9/2004 | Chiang et al. |
| 6,800,563 | B2 | 10/2004 | Xu |
| 6,815,704 | B1 | 11/2004 | Chen |
| 6,861,267 | B2 | 3/2005 | Xu et al. |
| 6,864,500 | B2 | 3/2005 | Gilton |
| 6,864,503 | B2 | 3/2005 | Lung |
| 6,867,638 | B2 | 3/2005 | Saiki et al. |
| 6,888,750 | B2 | 5/2005 | Walker et al. |
| 6,894,305 | B2 * | 5/2005 | Yi et al. .............................. 257/4 |
| 6,897,467 | B2 | 5/2005 | Doan et al. |
| 6,927,410 | B2 | 8/2005 | Chen |
| 6,933,516 | B2 | 8/2005 | Xu |
| 6,936,840 | B2 | 8/2005 | Sun et al. |
| 6,937,507 | B2 | 8/2005 | Chen |
| 6,969,866 | B1 | 11/2005 | Lowrey et al. |
| 6,992,932 | B2 | 1/2006 | Cohen |
| 7,018,911 | B2 | 3/2006 | Lee et al. |
| 7,321,130 | B2 | 1/2008 | Lung et al. |
| 7,485,891 | B2 | 2/2009 | Hamann et al. |
| 7,504,653 | B2 | 3/2009 | Lung |
| 7,560,337 | B2 | 7/2009 | Ho et al. |
| 7,606,059 | B2 | 10/2009 | Toda |
| 2002/0042158 | A1 | 4/2002 | Kersch et al. |
| 2003/0003647 | A1 | 1/2003 | Dennison et al. |
| 2003/0215978 | A1 | 11/2003 | Maimon et al. |
| 2003/0219924 | A1 | 11/2003 | Bez et al. |
| 2004/0026686 | A1 | 2/2004 | Lung |
| 2004/0114317 | A1 | 6/2004 | Chiang et al. |
| 2004/0248339 | A1 | 12/2004 | Lung |
| 2005/0019975 | A1 | 1/2005 | Lee et al. |
| 2005/0127347 | A1 | 6/2005 | Choi et al. |
| 2005/0215009 | A1 | 9/2005 | Cho |
| 2006/0001174 | A1 | 1/2006 | Matsui |
| 2006/0003263 | A1 | 1/2006 | Chang |
| 2006/0077741 | A1 | 4/2006 | Wang et al. |
| 2006/0110878 | A1 | 5/2006 | Lung et al. |
| 2007/0045605 | A1 | 3/2007 | Hsueh |
| 2007/0045606 | A1 | 3/2007 | Magistretti et al. |
| 2007/0161186 | A1 * | 7/2007 | Ho .................................. 438/257 |
| 2009/0298223 | A1 | 12/2009 | Cheek et al. |
| 2010/0291747 | A1 | 11/2010 | Lung et al. |
| 2011/0034003 | A1 | 2/2011 | Lung |

FOREIGN PATENT DOCUMENTS

WO 0145108 A1 6/2001

OTHER PUBLICATIONS

Adler, David, "Amorphous-Semiconductor Devices," Sci. Amer., vol. 236, pp. 36-48, May 1977.

Ahn, S. J. et al., "A Highly Manufacturable High Density Phase Change Memory of 64 Mb and Beyond," IEEE IEDM Dec. 13-15, 2004, pp. 907-910.

Axon Technologies Corporation paper: Technology Description, published at least as early as Dec. 1997, pp. 1-6.

Bedeschi, F. et al., "4-MB MOSFET-Selected Phase-Change Memory Experimental Chip," IEEE, Sep. 21-23, 2004, 4 PP.

Blake thesis, "Investigation of GeTeSb5 Chalcogenide Films for use as an Analog Memory," AFIT/GE/ENG/00M-04, Mar. 2000, 121 pages.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," Jun. 14-16, 2005 Symposium on VLSI Technology Digest of Technical Papers, pp. 96-97.

Gill, Manzur et al., "A High-Performance Nonvolatile Memory Technology for Stand-Alone Memory and Embedded Applications," Feb. 3-7, 2002 IEEE-ISSCC Technical Digest (TD 12.4), 7 pp.

Ha, Y. H. et al., "An Edge Contact Type Cell for Phase Change RAM Featuring Very Low Power Consumption," Jun. 10-12, 2003 Symposium on VLSI Technology Digest of Technical Papers, pp. 175-176.

Haring Bolivar, P. et al., "Lateral Design for Phase Change Random Access Memory Cells with Low-Current Consumption," presented at 3rd E PCOS 04 Symposium in Balzers, Principality of Liechtenstein, Sep. 4-7, 2004, 4pp.

Horii, H. et al., "A Novel Cell Technology Using N-doped GeSbTe Films for Phase Change RAM," Jun. 10-12, 2003 Symposium on VLSI Technology Digest of Technical Papers, pp. 177-178.

Hwang, Y. N. et al., "Full Integration and Reliability Evaluation of Phase-change RAM Based on 0.24um-CMOS Technologies," Jun. 10-12, 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Kim, Kinam et al., "Reliability Investigations for Manufacturable High Density PRAM," IEEE 43rd Annual International Reliability Physics Symposium, San Jose, Apr. 17-21, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM Dec. 13-15, 2004, 4 pp.

Lai, Stefan, "Current Status of the Phase Change Memory and its Future," IEEE IEDM Dec. 10, 2003, pp. 255-258.

Lai, Stephan et al., "OUM-A 180 nm Nonvolatile Memory Cell Element Technology for Stand Alone and Embedded Applications," IEEE IEDM Dec. 2-5, 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel u Trench Phase -Change Memory Cell for Embedded and Stand-Alone Non-Volatile Memory Applications," Jun. 15-17, 2004 Symposium on VLSI Technology Digest of Technical Papers, pp. 18-19.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Rochefort, C. et al., "Manufacturing of High Aspect-Ration p-n Junctions Using Vapor Phase Doping for Application in Multi-Resurf Devices," IEEE Jun. 4-7, 2002, pp. 237-240.

Strauss, Karl F. et al., "Overview of Radiation Tolerant Unlimited Write Cycle Non-Volatile Memory," IEEE Mar. 18-25, 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era-vol. 4, pp. 674-679, 2004.

Yi, J. H. et al., "Novel Cell Structure of PRAM with Thin Metal Layer Inserted GeSbTe," IEEE IEDM Dec. 10, 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

* cited by examiner

RESISTOR RANDOM ACCESS MEMORY CELL WITH L-SHAPED ELECTRODE

CROSS-REFERENCE TO RELATED APPLICATIONS

This application is a divisional of co-pending U.S. patent application Ser. No. 11/421,036 filed on 30 May 2006, which application is incorporated herein by reference.

This application is related to co-pending U.S. patent application Ser. No. 11/421,042 filed on 30 May 2006 and owned by the same assignee.

BACKGROUND OF THE INVENTION

1. Field of the Invention

The present invention relates to high density memory devices based on phase change based memory materials, including chalcogenide based materials and on other programmable resistive materials, and to methods for manufacturing such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or break down the crystalline structure, after which the phase change material cools quickly, quenching the phase change process, allowing at least a portion of the phase change structure to stabilize in the amorphous state. It is desirable to minimize the magnitude of the reset current used to cause transition of phase change material from the crystalline state to the amorphous state. The magnitude of the reset current needed for reset can be reduced by reducing the size of the phase change material element in the cell and of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

A technology developed by the assignee of the present application is referred to as a phase change bridge cell, in which a very small patch of memory material is formed as a bridge across a thin film insulating member between electrodes. The phase change bridge is easily integrated with logic and other types of circuitry on integrated circuits. See, U.S. application Ser. No. 11/155,067, filed 17 Jun. 2005, entitled "Thin Film Fuse Phase Change RAM and Manufacturing Method," by Lung et al., which application was owned at the time of invention and is currently owned by the same assignee.

Problems have arisen in manufacturing such devices with very small dimensions, and with variations in process that meet tight specifications needed for large-scale memory devices. It is desirable therefore to provide a memory cell structure having small dimensions and low reset currents, and a method for manufacturing such structure that meets tight process variation specifications needed for large-scale memory devices. It is further desirable to provide a manufacturing process and a structure which are compatible with manufacturing of peripheral circuits on the same integrated circuit.

SUMMARY OF THE INVENTION

A phase change random access memory PCRAM device is described suitable for use in large-scale integrated circuits. Technology described herein includes a memory device which has a first electrode comprising a portion of a first electrode layer and having a first electrode length on a sidewall of a sidewall support structure. A sidewall spacer insulating member having a sidewall spacer insulating member length comprising a portion of a first sidewall spacer layer is disposed on the first electrode. A second electrode having a second electrode length comprising a portion of a second sidewall spacer layer is disposed on the first sidewall spacer layer. The second electrode has a horizontal portion that extends radially away from the first electrode. A bridge having a bridge width, extends from a top surface of the first electrode to a top surface of the second electrode across a top surface of the sidewall spacer insulating member. The bridge comprises memory material. An electrical contact, such as a conductive plug adapted to couple to a bit line above the bridge, is connected to the horizontal portion of the second electrode. The second electrode has an "L-shape" in cross section, with the bridge contacting the top of the "L" and the conductive plug contacting horizontal portion of the "L". The horizontal portion of the second electrode has a length sufficient for connection to the contact plug plus alignment tolerances for a manufacturing technique used to form the contact plug, but not so long as to connect with the second electrode of an adjacent cell. The second electrode structure is self-aligned with the first electrode and insulating member, and can be formed without requiring lithographic steps.

The inter-electrode path across the sidewall spacer insulating member between the first and second electrodes has a path length defined essentially by the thickness of the first sidewall spacer layer. The bridge comprises a programmable resistive material. For the phase change memory, the bridge comprises memory material having at least two solid phases that are reversible, such as a chalcogenide-based material or other related material, by applying a current through the material or applying a voltage across the first and second electrodes.

The active volume of memory material subject of programmable resistance can be very small. For the purpose of this disclosure, when referring to the dimensions of the structures in the cell, the "length" refers to the distance in the x-direction (left to right in FIG. 1B), which for the sidewall spacer insulating member and the sidewall electrodes, is determined by the thicknesses of the first electrode and spacer layers used to form the sidewalls. The "thickness" of a structure in the cell refers to distance in the y-direction (up and down in FIG. 1B), and the "width" refers to distance in the z-direction (perpendicular to the plane of the drawing in FIG. 1B). Thus the active volume of memory material is determined by the length of the sidewall insulating member (x-direction), the thickness of the thin film used to form the bridge (y-direction), the width of the bridge orthogonal to the conductive path length (z-direction), and the length of the side wall electrode structures (x-direction) acting as contacts to the bridge. The small contact areas, defined by the lengths of the first and second electrodes and the width of the bridge, improve thermal isolation of the bridge by reducing the area of contact to the electrode material which has relatively high thermal conductivity. The small contact areas also serve to concentrate current flow, increasing current density in the bridge. The improved thermal isolation and increased current density improve reset operation of the cell, particularly for cells comprising bridges of phase change material.

The length of the electrode structures and the thickness of the thin film of memory material used to form the bridge are determined in embodiments of the technology by thin film thicknesses which are not limited by the lithographic processes used in manufacturing the memory cell. Optionally, the width of the bridge is also smaller than a minimum feature size F that is specified for a lithographic process used in patterning the layer of material in embodiments of the present invention. In one embodiment, the width of the bridge is defined using photoresist trimming technologies in which a mask pattern is used to define a lithographical photoresist structure on the chip having the minimum feature size F, and the photoresist structure is trimmed by isotropic etching to achieve a feature size less than F. The trimmed photoresist structure is then used to lithographically transfer the more narrow pattern onto the layer of insulating material on memory material. Also, other techniques can be used to form narrow lines of material in a layer on an integrated circuit. Accordingly, a phase change memory cell with simple structure achieves very small reset current and low power consumption, and is easily manufactured.

In some embodiments of the technology described herein, an array of memory cells is provided. In the array, a plurality of electrode members and sidewall spacer insulating members therebetween comprise a planarized interface in an integrated circuit. The corresponding plurality of thin film bridges across the sidewall spacer insulating members between pairs of electrode members comprises memory elements on the top surfaces of the electrode layer and sidewall spacer insulating members. A current path from a first electrode through a thin film bridge on the top surface of the sidewall spacer insulating member to a second electrode is established for memory cells in the array.

Circuitry below the electrode layer on integrated circuits described herein can be implemented using well understood technology for logic circuitry and memory array circuitry, such as CMOS technology.

Also, in one array embodiment described herein, circuitry above the electrode layer includes a plurality of bit lines. In an embodiment having bit lines above the electrode layer that is described herein, electrode members that act as second electrodes for a memory cell are shared so that a single bit line contacts multiple second electrodes, and hence multiple memory cells. Also, in an embodiment that is described herein, bit lines in the plurality of bit lines are arranged along corresponding columns in the array, and two adjacent memory cells in the corresponding columns share a contact structure for contacting said second electrodes.

A method for manufacturing a memory device is also described. An embodiment of the method comprises forming a sidewall support structure, such as a small diameter pillar, having a sidewall. A first electrode layer is deposited on the sidewall and a first electrode is formed from the first electrode layer. An insulating sidewall spacer layer is deposited over the first electrode, a conductive sidewall spacer layer is deposited on the insulating sidewall spacer layer, and a third sidewall spacer layer is deposited on the conductive sidewall spacer layer. A third sidewall spacer is formed from the third sidewall spacer layer and a second electrode is formed from the conductive sidewall spacer layer. The second electrode has a horizontal portion underlying the third sidewall spacer. A layer of dielectric material is deposited over the memory device and planarized to form a planarized surface including a top surface of the first electrode, a top surface of the insulating sidewall spacer layer, and a top surface of the second electrode. A bridge of memory material is formed between the first electrode and the second electrode across the top surface of the insulating sidewall spacer layer. The bridge comprises a patch of memory material contacting the top surface of the first electrode and the top surface of the second electrode to define an inter-electrode path between the first electrode and second electrode having a path length defined by a thickness of the insulating sidewall spacer layer.

Other aspects and advantages of the invention are described below with reference to the figures.

DETAILED DESCRIPTION

A detailed description of thin film fuse phase change memory cells, arrays of such memory cells, and methods for manufacturing such memory cells, is provided with reference to FIGS. 1A-16.

Figure 1A:
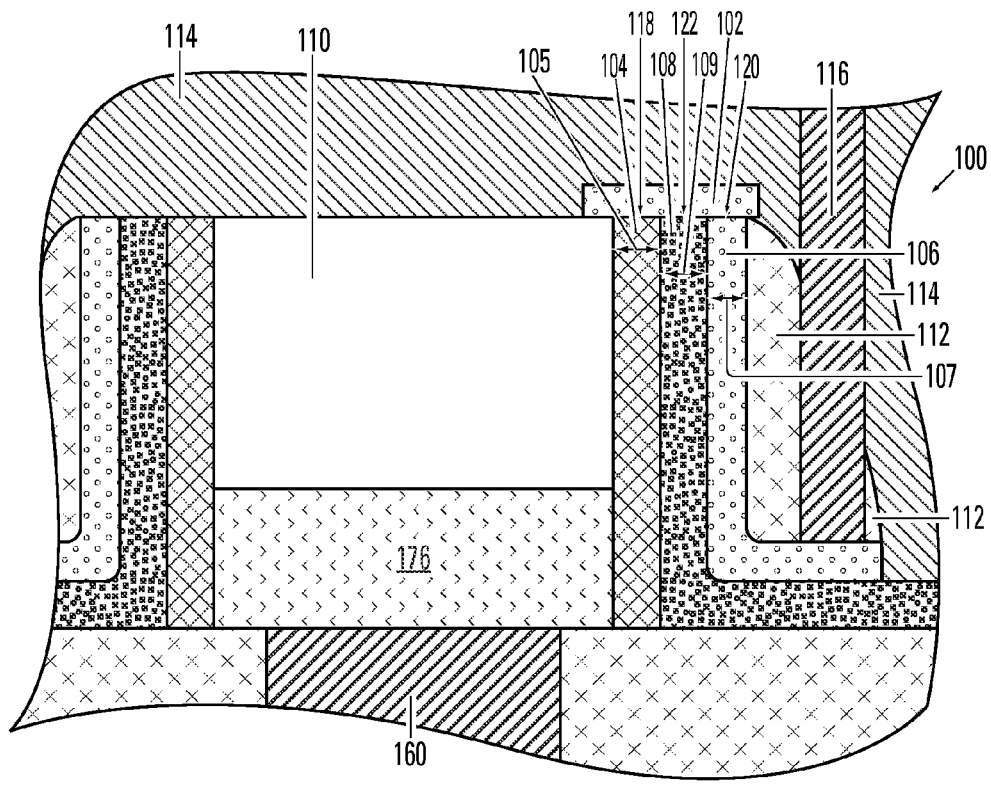
FIG. 1A illustrates an embodiment of a thin film bridge phase change memory device.

FIG. 1A illustrates a basic structure of a memory device 100 including a bridge 102 of memory material, such as programmable resistive material, on electrodes 104, 106. A first electrode 104 has a first electrode length, represented by a double-ended arrow 105. A second electrode 106 has a second electrode length, represented by a double-ended arrow 107, and a sidewall spacer insulating member 108 between the first electrode 104 and the second electrode 106 has a sidewall insulating member length represented by a double arrow 109. The first electrode length typically depends on the thickness of a first electrode layer deposited as a sidewall on the pillar shaped sidewall support structure 110, which can be optionally thinned after deposition.

A pillar shaped sidewall support structure includes an insulating top portion 110 and a conductive portion 176 in electrical communication with the contact 160, which is coupled to the underlying access circuits. The first electrode comprises a pipe-shaped member, where the sidewalls having an inside surface and an outside surface, which are cylinder-like. Thus, the inside and outside surfaces can be understood as basically cylindrical surfaces, classically defined as surfaces traced by a line moving parallel to a fixed line and intersecting a fixed curve, where for a circular cylinder the fixed line lies at the center, or axis, of the pipe-shaped member and the fixed curve is a circle centered on the fixed line. The inside and outside surfaces for this circular cylindrical shape would be defined by respective circles having radii that differ by the thickness of the layer of material used to form the first electrode 104, and thus define the inside and outside diameters of the pipe-shaped member. In embodiments of the pipe-shaped member, the cylinder-like shape has an outside perimeter that is circular, elliptical, rectangular or somewhat irregularly shaped, depending on the manufacturing technique applied to form the pipe-shaped member. A "ring-shaped" top surface is provided on the first electrode, which is not necessarily circular, but rather takes the shape of a cross-section of the pipe-shaped member.

The insulating top portion 110 of the sidewall support structure is preferably made from a thermally insulating material, such as silicon dioxide, porous silicon dioxide, or polymer, to confine heat generated during the programming and resetting operations of the bridge 102. For example, the insulating top portion 110 may comprise a better thermal insulator than the material of fill layer 114, preferably at least 10% better. Therefore, when the inter-layer dielectric comprises silicon dioxide, the sidewall support structure 110 preferably has a thermal conductivity value "kappa" of less than that of silicon dioxide which is 0.014 J/cm*K*sec. In other preferred embodiments, the thermal insulator has a thermal conductivity less than that of the amorphous state of the phase change material, or less than about 0.003 J/cm*K*sec for a phase change material comprising GST. Representative materials include low permitivity (low-K) materials, including materials that are a combination of the elements silicon Si, carbon C, oxygen O, fluorine F, and hydrogen H. Examples of thermally insulating materials which are candidates for use as thermal insulators include SiCOH, polyimide, polyamide, and fluorocarbon polymers. Other examples of materials which are candidates for use for thermal insulators include fluorinated SiO2, silsesquioxane, polyarylene ethers, parylene, fluoro-polymers, fluorinated amorphous carbon, diamond like carbon, porous silica, mesoporous silica, porous silsesquioxane, porous polyimide, and porous polyarylene ethers. A single layer or combination of layers can provide thermal insulation. Confining heat in the bridge 102 of memory material is desirable because it reduces the energy required for the programming and resetting operations. Alternatively, the sidewall support structure is made from a conductive material or other material. If more thermally conductive material is used for the sidewall support structure, detrimental heat conductivity effects can be mitigated by positioning the bridge so that there is little or no overhang from the first electrode over the sidewall support structure.

The sidewall spacer insulating member 108, the second electrode 106, and a second sidewall spacer insulating member 112 are formed on the sidewalls of the first electrode 104. In a particular embodiment the sidewall spacer insulating member 108 is an oxide, such as silicon dioxide, or other dielectric material that is preferably both electrically and thermally insulating, the second electrode 106 is a electrically conductive material, such as TiN, metal, intermetallic material, or conductive semiconductor material, and the second sidewall spacer insulating member 112 is also an oxide or other dielectric material, either the same as or different from the material of the sidewall spacer insulating member.

Insulating fill 114 is deposited on and over other structures of the memory cell 100 in the illustrated embodiment, providing support for subsequent patterned metal layers, such as the conductive plug 116. The first and second electrodes 104, 106 have top surfaces 118, 120 that contact the bridge 102 at electrode contact areas, which are essentially the areas defined by the width (W) of the bridge (see FIG. 10B) and the lengths 105, 107 of the electrodes. Likewise, the sidewall spacer insulating member 108 has a top surface 122, and the bridge 102 has an active region (see FIG. 1B, ref num. 124) generally confined within the length 109 of the sidewall spacer insulating member 108. The active region of the bridge 102 represents the active volume of memory material that switches states during programming and resetting of the memory. The bridge 102 of memory material lies on the planar top surface 118 of the first electrode 104, the planar top surface 122 of the sidewall spacer insulating member 108 (preferably, but not necessarily, co-planar with the planar top surface 118 of the first electrode 104), and the planar top surface 120 of the second electrode 114 of the electrode layer. The bridge 102 overlies portions of the planarized second sidewall spacer insulating member 112 and sidewall support structure 110 by an amount sufficient to provide alignment tolerances for the placement of the bridge 102 on the electrodes. Contacts between the first electrode 104 and the bridge 102 and between the second electrode 106 and the bridge 102 are made on the bottom side of the bridge.

Figure 1B:
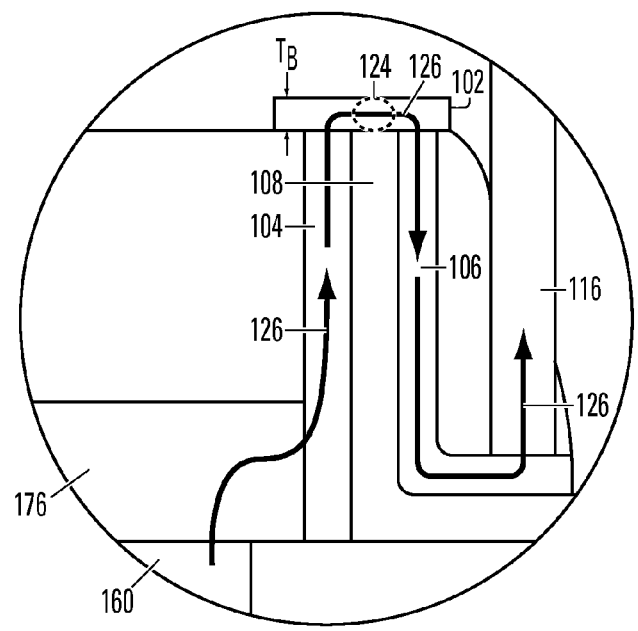
FIG. 1B shows additional details of a portion of the memory device of FIG. 1A.

FIG. 1B shows additional details of a portion of the memory device of FIG. 1A. An active region of memory material, represented by dashed line 124 in the bridge 102 changes resistance during programming and resetting operations, and maintains its restive state between programming and resetting operations, allowing the resistance of the memory cell to be read, thus indicating a logic condition.

The volume of memory material in the active region 124 subject to programmable resistance can be very small, confined within a volume of material determined by the length of the sidewall spacer insulating member, which results from the deposited layer's thickness and etch process, and the width and thickness of the bridge $T_B$. The lengths of the electrodes that contact the bridge similarly depend on the thickness of the deposited electrode layers. These lengths (i.e. of the electrodes 104, 106 and sidewall spacer insulating member 108), and the thickness of the layer of memory material used to form the bridge 102, are determined in embodiments of the technology by thin film thicknesses, and are not limited by the minimum feature size F of lithographic processes used in manufacturing the memory cell. In a particular embodiment, the width of the bridge (see FIG. 10B, W) is also smaller than a minimum feature size F that is specified for a lithographic process used in patterning the layer of material in embodiments of the present invention. In one embodiment, the width of the bridge is defined using photoresist trimming technologies in which a mask pattern is used to define a lithographical photoresist structure on the chip having the minimum feature size F, and the photoresist structure is trimmed by isotropic etching to achieve a feature size less than F. The trimmed photoresist structure is then used to lithographically transfer the narrowed pattern onto the layer of memory material. Also, other techniques can be used to form narrow lines of material in a layer on an integrated circuit. Accordingly, a phase change memory cell with simple structure achieves very small reset current and low power consumption, and is easily manufactured.

In operation, a current path ("inter-electrode path"), represented by arrows 126 (the direction of the arrows is arbitrary and does not necessarily indicate the actual direction of current flow), from a first electrical contact 160, such as a metal plug, through a conductor portion 176, the first electrode 104, through the active region 124 of the bridge 102, to the second electrode 106 and then to a second electrical contact 116, such as a metalized via, is formed by the memory cell structure. Access circuitry can be implemented to contact the first electrode 104 and the second electrode 106 in a variety of configurations for controlling the operation of the memory cell, so that it can be programmed to set the bridge 102 with a programmable resistance to indicate a data value. For example, using a chalcogenide-based phase change memory material, the memory cell may be set to a relatively high resistivity state in which at least a portion of the bridge in the current path is in an amorphous state, and a relatively low resistivity state, in which all or most of the bridge in the current path is in a crystalline state.

The active region 124 of the memory cell is the region for a phase change memory cell embodiment in which the material is induced to change between the at least two solid phases. As can be appreciated, the active region 124 can be made extremely small in the illustrated structure, reducing the magnitude of current needed to induce the phase changes during programming and re-setting operations.

Embodiments of the memory cell include phase change based memory materials, including chalcogenide based materials and other materials, for the bridge 102. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording", *SPIE* v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including $N_2$ doped GST, $Ge_xSb_y$, or other material that uses different crystal phase changes to determine resistance; $Pr_xCa_yMnO_3$, PrSrMnO, ZrOx, or other material that uses an electrical pulse to change the resistance state; 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, C60-TCNQ, TCNQ doped with other metal, or any other polymer material that has bistable or multi-stable resistance state controlled by an electrical pulse.

The following are short summaries describing four types of resistive memory materials. The first type is chalcogenide material, such as $Ge_xSb_yTe_z$ where x:y:z=2:2:5, or other compositions with x: 0~5; y: 0~5; z: 0~10. GeSbTe with doping, such as N—, Si—, Ti—, or other element doping is alternatively used.

An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually done at room temperature. A collimater with an aspect ratio of 1~5 can be used to improve the fill-in performance. To improve the fill-in performance, a DC bias of several tens of volts to several hundreds of volts is also used. On the other hand, the combination of DC bias and the collimater can be used simultaneously.

A post-deposition annealing treatment in vacuum or in an $N_2$ ambient is optionally performed to improve the crystallize state of chalcogenide material. The annealing temperature typically ranges from 100° C. to 400° C. with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states.

A second type of memory material suitable for use in embodiments is colossal magnetoresistance ("CMR") material, such as $Pr_xCa_yMnO_3$ where x:y=0.5:0.5, or other compositions with x: 0~1; y: 0~1. CMR material that includes Mn oxide is alternatively used.

An exemplary method for forming CMR material uses PVD sputtering or magnetron-sputtering method with source gases of Ar, $N_2$, $O_2$, and/or He, etc. at the pressure of 1 mTorr~100 mTorr. The deposition temperature can range from room temperature to ~600° C., depending on the post deposition treatment condition. A collimater with an aspect ratio of 1~5 can be used to improve the fill-in performance. To improve the fill-in performance, the DC bias of several tens of volts to several hundreds of volts is also used. On the other hand, the combination of DC bias and the collimater can be used simultaneously. A magnetic field of several tens of Gauss to as much as a Tesla (10,000 Gauss) may be applied to improve the magnetic crystallized phase.

A post-deposition annealing treatment in vacuum or in an $N_2$ ambient or $O_2/N_2$ mixed ambient is optionally used to improve the crystallized state of CMR material. The annealing temperature typically ranges from 400° C. to 600° C. with an anneal time of less than 2 hours.

The thickness of CMR material depends on the design of the cell structure. The CMR thickness of 10 nm to 200 nm can be used for the core material. A buffer layer of YBCO ($YBaCuO_3$, which is a type of high temperature superconductor material) is often used to improve the crystallized state of CMR material. The YBCO is deposited before the deposition of CMR material. The thickness of YBCO ranges from 30 nm to 200 nm.

A third type of memory material is two-element compounds, such as $Ni_xO_y$; $Ti_xO_y$; $Al_xO_y$; $W_xO_y$; $Zn_xO_y$; $Zr_xO_y$; $Cu_xO_y$; etc, where x:y=0.5:0.5, or other compositions with x: 0~1; y: 0~1. An exemplary formation method uses a PVD sputtering or magnetron-sputtering method with reactive gases of Ar, $N_2$, $O_2$, and/or He, etc. at the pressure of 1 mTorr~100 mTorr, using a target of metal oxide, such as $Ni_xO_y$; $Ti_xO_y$; $Al_xO_y$; $W_xO_y$; $Zn_xO_y$; $Zr_xO_y$; $Cu_xO_y$; etc. The deposition is usually done at room temperature. A collimater with an aspect ratio of 1~5 can be used to improve the fill-in performance. To improve the fill-in performance, the DC bias of several tens of volts to several hundreds of volts is also used. If desired, the combination of DC bias and the collimater can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an anneal time of less than 2 hours.

An alternative formation method uses a PVD sputtering or magnetron-sputtering method with reactive gases of $Ar/O_2$, $Ar/N_2/O_2$, pure $O_2$, $He/O_2$, $He/N_2/O_2$ etc. at the pressure of 1 mTorr~100 mTorr, using a target of metal oxide, such as Ni, Ti, Al, W, Zn, Zr, or Cu etc. The deposition is usually done at room temperature. A collimater with an aspect ratio of 1~5 can be used to improve the fill-in performance. To improve the fill-in performance, a DC bias of several tens of volts to several hundreds of volts is also used. If desired, the combination of DC bias and the collimater can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an anneal time of less than 2 hours.

Yet another formation method uses oxidation by a high temperature oxidation system, such as a furnace or a rapid thermal pulse ("RTP") system. The temperature ranges from 200° C. to 700° C. with pure $O_2$ or $N_2/O_2$ mixed gas at a pressure of several mTorr to 1 atm. The time can range several minute to hours. Another oxidation method is plasma oxidation. An RF or a DC source plasma with pure $O_2$ or $Ar/O_2$ mixed gas or $Ar/N_2/O_2$ mixed gas at a pressure of 1 mTorr to 100 mTorr is used to oxidize the surface of metal, such as Ni, Ti, Al, W, Zn, Zr, or Cu etc. The oxidation time ranges several seconds to several minutes. The oxidation temperature ranges from room temperature to 300° C., depending on the degree of plasma oxidation.

A fourth type of memory material is a polymer material, such as TCNQ with doping of Cu, $C_{60}$, Ag etc. or PCBM-TCNQ mixed polymer. One formation method uses evaporation by thermal evaporation, e-beam evaporation, or molecular beam epitaxy ("MBE") system. A solid-state TCNQ and dopant pellets are co-evaporated in a single chamber. The solid-state TCNQ and dopant pellets are put in a W-boat or a Ta-boat or a ceramic boat. A high electrical current or an electron-beam is applied to melt the source so that the materials are mixed and deposited on wafers. There are no reactive chemistries or gases. The deposition is done at a pressure of $10^{-4}$ Torr to $10^{-10}$ Torr. The wafer temperature ranges from room temperature to 200° C.

A post-deposition annealing treatment in vacuum or in an $N_2$ ambient is optionally performed to improve the composition distribution of polymer material. The annealing temperature ranges from room temperature to 300° C. with an anneal time of less than 1 hour.

Another technique for forming a layer of polymer-based memory material is to use a spin-coater with doped-TCNQ solution at a rotation of less than 1000 rpm. After spin-coating, the wafer is held (typically at room temperature or temperature less than 200° C.) for a time sufficient for solid-state formation. The hold time ranges from several minutes to days, depending on the temperature and on the formation conditions.

Figure 2A:
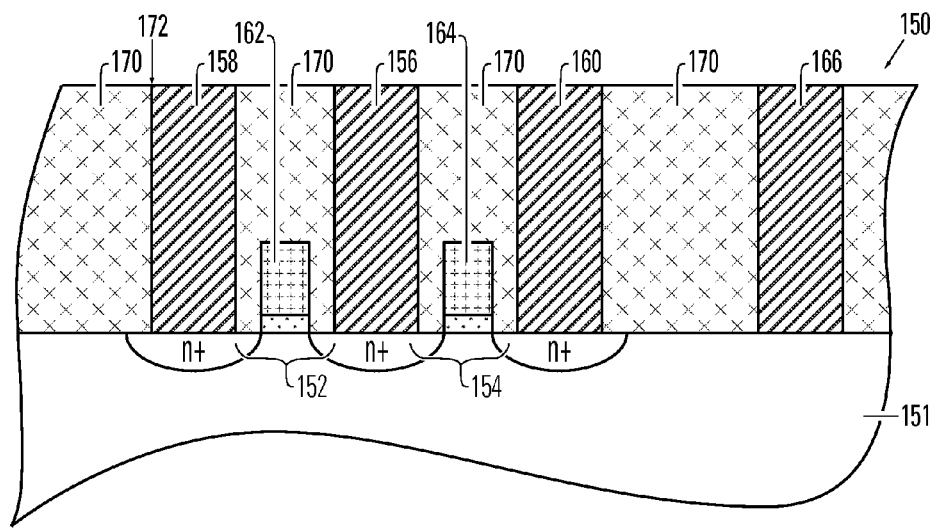
FIG. 2A through FIG. 14 are cross sections illustrating a fabrication sequence of an integrated circuit with a memory array including memory cells having small active regions and small electrode regions according to an embodiment of the invention.

FIG. 2A is a cross section of a portion of an integrated circuit ("IC") 150 fabricated on a substrate 151, such as a silicon wafer, having a partially fabricated memory array according to an embodiment. First and second transistors 152, 154, which in some applications are commonly referred to as "access transistors," have a common source line 156, a first drain contact 158, and a second drain contact 160, which in a particular embodiment are all tungsten plugs coupled to n+ doped regions in the substrate, but are alternatively other metals or other conductors, such as doped silicon or silicide, or combinations of conductive materials. For example, the common source line 156 may be implemented using buried diffusion n+ regions in the substrate, with or without silicide surface formations.

Gates 162, 164 form conductive channels electrically coupling the source line 156 and drain contacts 158, 160 according to electronic signals applied to the gates, as is well understood in the art of field-effect transistor operation. A peripheral contact 166 is similar to the other plugs. Insulating material 170 separates the source line 156 and the contacts 158, 160, 166 and gates 162, 164 and the insulating material and plugs have been planarized to form a surface 172 suitable for subsequent processing steps, as is well known in the art of IC fabrication. In a particular embodiment, the IC has been processed to this stage using conventional CMOS fabrication techniques, which may include additional features that are omitted for simplicity and clarity of illustration.

Figure 2B:
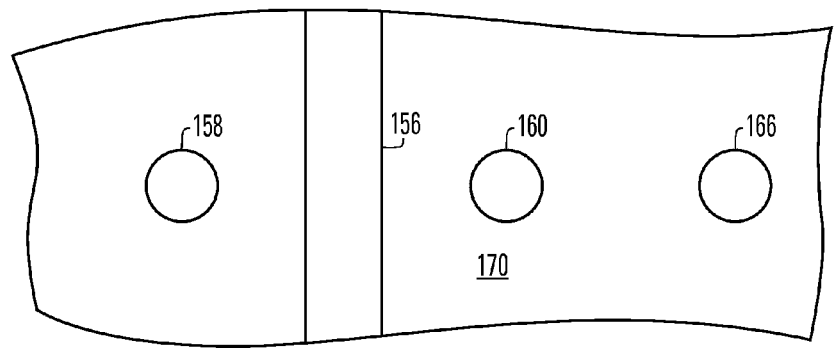

FIG. 2B is a plan view (not to scale) of the portion of the integrated circuit of FIG. 2A showing the source line 156 and the contacts 158, 160, 166 surrounded by the insulating material 170. The surface illustrated comprises an array of contacts for connection to underlying access circuits. The diameters of the contacts 158, 160, 166 can approach the minimum feature size for lithographic or other processes used to form contact plugs. For example, using current technologies, the contacts may have a diameter on the order of 90 to 120 nm. The contacts 158, 160 may be spaced apart by for example about 600 nm. The top view of the following figures could be circular, rectangular or square.

Figure 3:
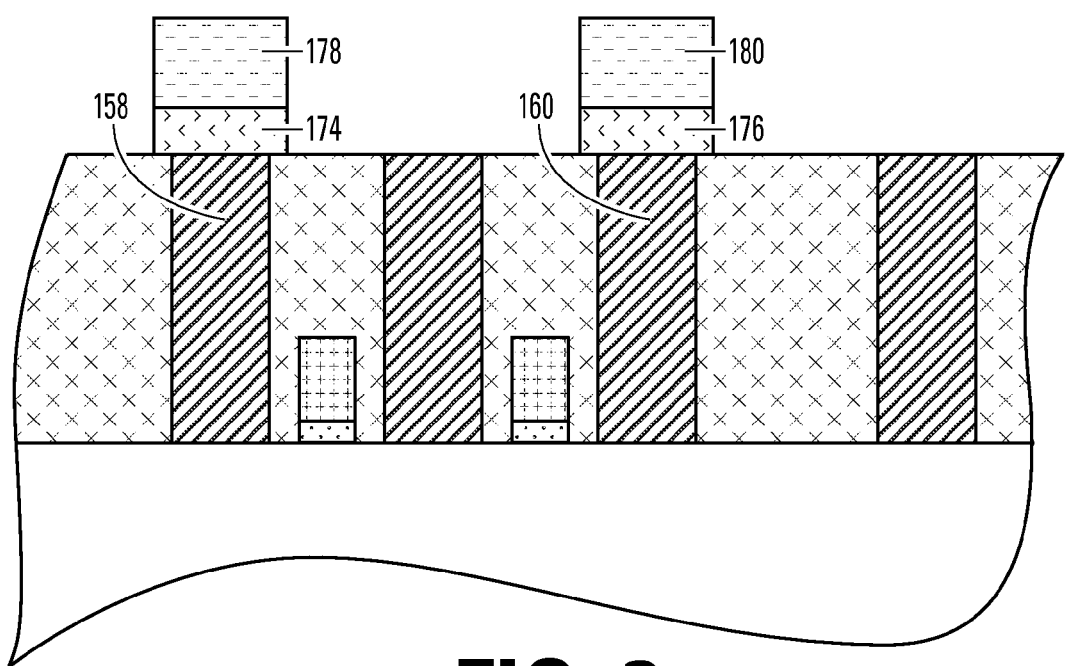

FIG. 3 is a cross section of the portion of the integrated circuit of FIG. 2A with cylindrical pillars acting as sidewall support structures comprising respective conductor portions 174, 176 and respective insulator structures 178, 180. The conductor portions 174, 176 are formed on the drain plugs 158, 160. In alternative embodiments, the conductor portions 174, 176 can be eliminated where contact to the plugs by the first electrodes (see FIG. 1A, ref num 104) can be reliably established.

The conductor portions 174, 176 are formed from a layer of conductive material using photolithographic techniques. In a particular embodiment using tungsten for the plugs 158, 160, the conductor portions 174, 176 are TiN or TiN/Al/TiN, or other conductive materials. The conductor portions are typically about 50 nm to about 200 nm thick and have a diameter determined by the feature sizes for plugs or pillars that can be accomplished by the manufacturing technologies used. For representative photolithographic technologies, the conductor portions can be about 90 nm in diameter; however, these values are merely exemplary.

The insulator structures 178, 180 of the pillars are formed from a layer of deposited oxide, such as silicon dioxide, a thermally insulating material or other material, and can serve as both a hard etch mask for etching the underlying layer that the conductor portions 174, 176 are patterned from, as well as provide support for subsequent electrode and spacer dielectric sidewalls. In an alternative embodiment, the sidewall support insulator structures 178, 180 are omitted, or are removed after etching the conductor portions.

In a particular embodiment, the sidewall support insulator structures 178, 180 have a cylindrical shape with a circular or near circular cross-section in a representative embodiment with a maximum radius near the radius of the corresponding contact plugs 158, 160, and aligned within lithographic process tolerances with corresponding contact plugs 158, 160. For example, in embodiments where the contact plugs have a diameter near 200 nm, the diameter of the sacrificial portions may be in a range of about 200 to 300 nm. In other embodiments, the cross-section of the cylindrical shape of the sidewall support structures and conductive portions can be square, rectangular or irregularly shaped. In a particular embodiment, the sidewall support structures are about 50 nm to about 200 nm thick; however, these values are merely exemplary.

Figure 4:
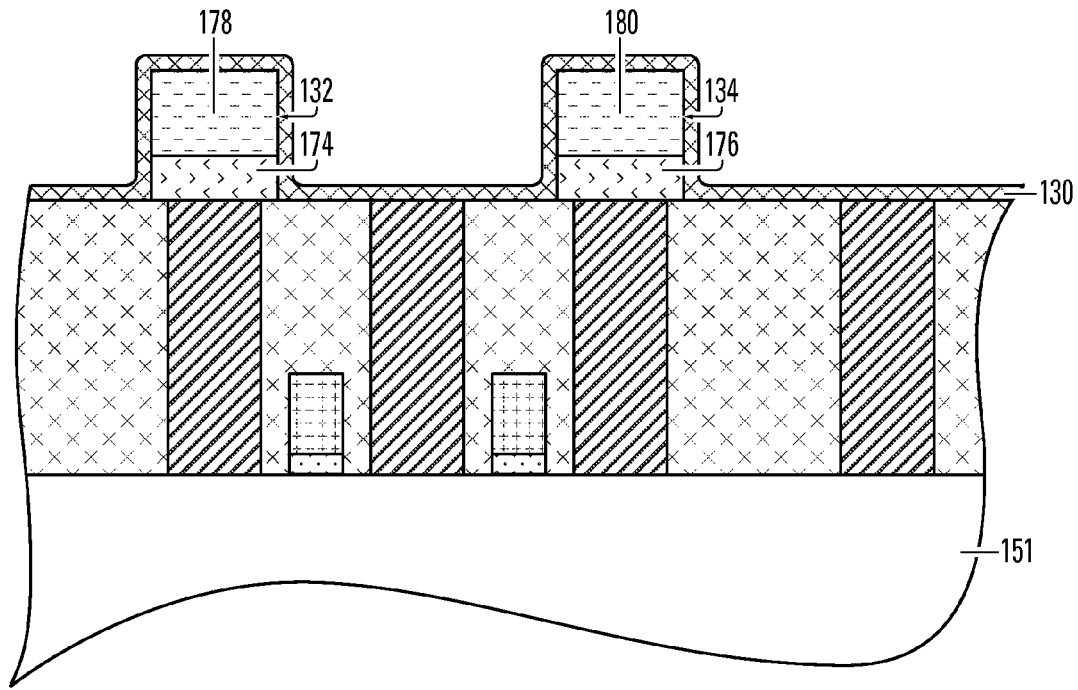

FIG. 4 is a cross section of the portion of the integrated circuit of FIG. 3 with a layer of electrode material 130 deposited to cover the sidewalls 132, 134 (i.e. the outside diameters) of the sidewall support structures including the sidewalls of the conductor portions 174, 176, and generally the field of the substrate 151. In a particular embodiment the layer of electrode material comprises TiN, TiN/Al/TiN or other material selected for compatibility with the conductor portions 174, 176 and the memory material, and is between about 50 Angstroms and about 500 Angstroms thick.

Figure 5:
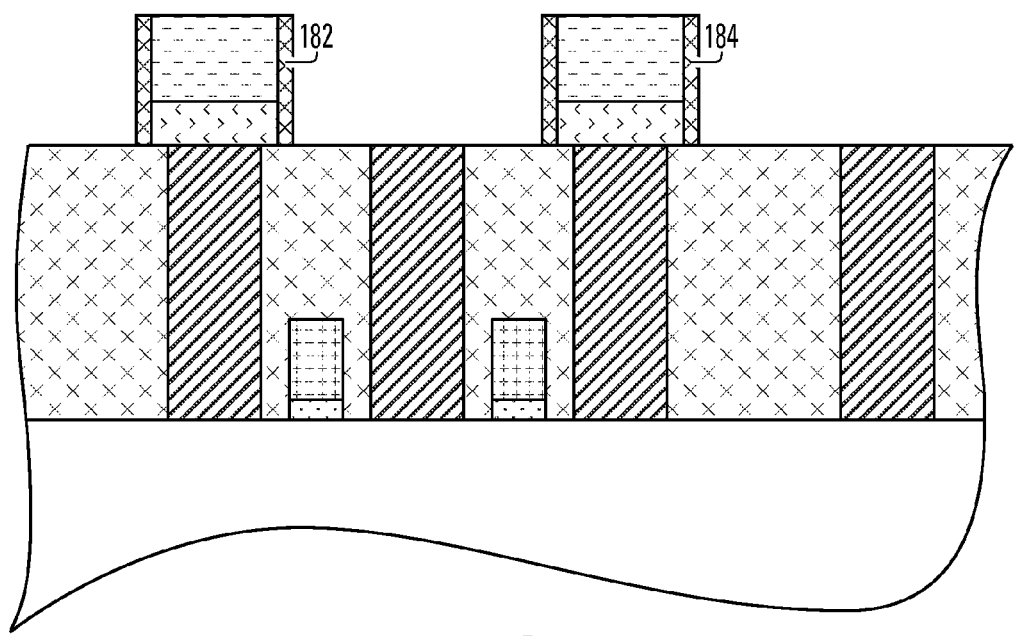

FIG. 5 is a cross section of the portion of the integrated circuit of FIG. 4 after anisotropically etching the layer of electrode material to form first sidewall electrodes 182, 184 (compare with FIG. 1A, ref num. 104) coupled to the conductor portions 174, 176 or otherwise in electrical communication with the contacts 158, 160.

Figure 6:
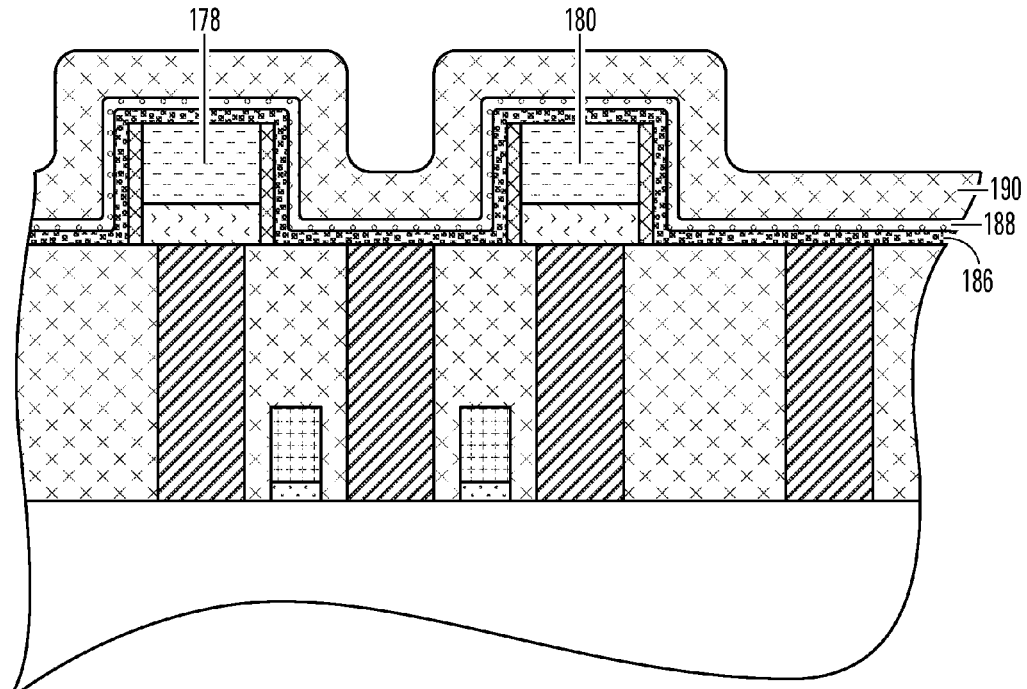

FIG. 6 is a cross section of the portion of the integrated circuit of FIG. 5 after a first sidewall spacer layer 186, which comprises insulating material, such as an oxide, and a second sidewall spacer layer 188, which in a particular embodiment is an electrically conductive electrode material, such as a material discussed above in connection with the first electrode, and a third sidewall spacer layer, which in a particular embodiment comprises an oxide or other material, including a thermally insulating material as discussed above.

Figure 7:
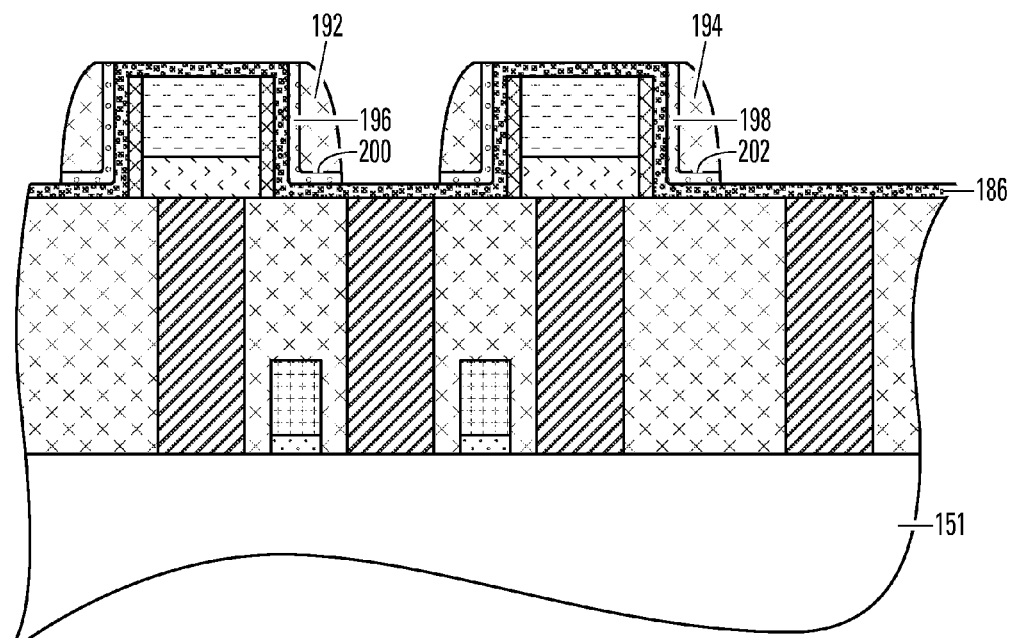

In the example of FIG. 6, the first sidewall spacer insulator layer 186 is a first sidewall spacer layer, the second sidewall spacer layer 188 is a second electrode layer, and the third sidewall spacer layer 190 forms a third sidewall spacer (see FIG. 7, ref nos. 192, 194). In a particular embodiment, the first sidewall spacer layer 186 is a layer oxide, such as silicon dioxide, about 20 nm thick, the second sidewall spacer layer 188 is a layer of TiN between about 5 nm thick and about 30 nm thick, and in a more particular embodiment about 10 nm thick. The third sidewall spacer layer 190 is a layer of oxide, such as silicon oxide, about 200 nm thick.

FIG. 7 is a cross section of the portion of the integrated circuit of FIG. 6 after anisotropically etching the second and third spacer layers (see FIG. 6, ref nos. 188, 190) down to the first spacer layer 186. A two-step etch technique is used. A first etch technique, such as a directional plasma etch, is used to anisotropically etch the third sidewall spacer layer material (see FIG. 6, ref num. 190) to form third sidewall spacers 192, 194, and then a second etch technique is used to etch the second spacer layer material (see FIG. 6, ref num. 188) to form second sidewall electrodes 196, 198. The second sidewall electrodes 196, 198 are "L-shaped" spacers and have horizontal portions 200, 202 that lie essentially parallel to the major surface of the substrate 151 underneath the third sidewall spacers 192, 194. For an embodiment having a 200 nm thick third spacer layer, the horizontal portions extend radially away from the first electrodes for a length of about 200 nm. In embodiments of the technology, the horizontal portion has a length sufficient for connection to the contact plugs (116 in FIG. 1A, and 248, 250 in FIG. 14) plus alignment tolerances for a manufacturing technique used to form the contact plugs. Preferably, the length of the horizontal portion is less than about 300 nm, from the vertical portion of the "L" to the end of the horizontal portion. Alternatively, the third sidewall spacers 192, 194 are removed after forming the L-shaped electrodes 196, 198.

Figure 8:
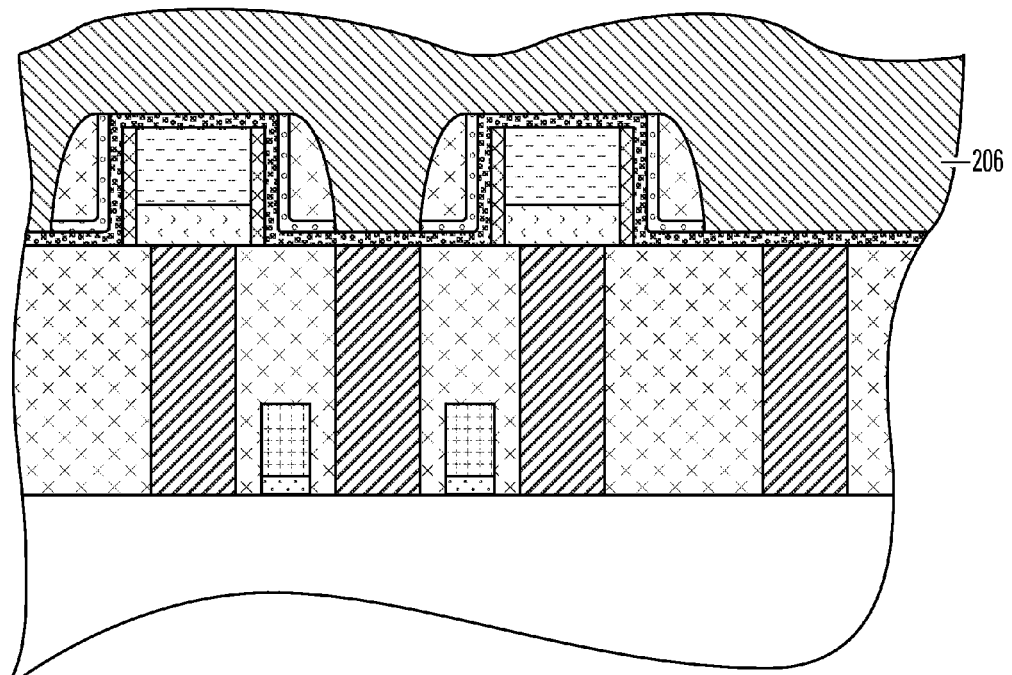

FIG. 8 is a cross section of the portion of the integrated circuit of FIG. 7 after a layer of dielectric material 206 has been deposited over the integrated circuit. Such a layer is commonly called an inter-metal dielectric ("IMD") layer, comprising one or more layers of insulating material.

Figure 9:
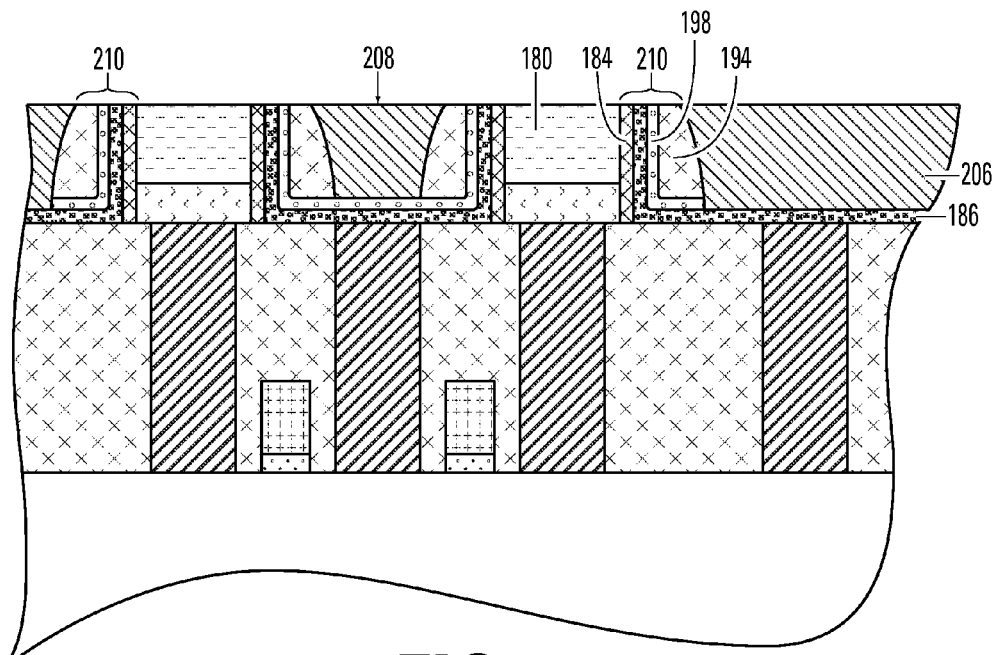

FIG. 9 is a cross section of the portion of the integrated circuit of FIG. 8 after the IMD layer 206 has been planarized, such as by using a CMP technique, to provide a planarized surface 208. Portions 210 of the planarized surface 208 include third sidewall spacer 194, second sidewall spacer (second electrode) 198, first sidewall spacer layer (sidewall spacer dielectric member) 186, first electrode 184 and sidewall support structure 180. These portions 210 provide a flat surface for defining bridges of memory material using photolithographic techniques.

Figure 10A:
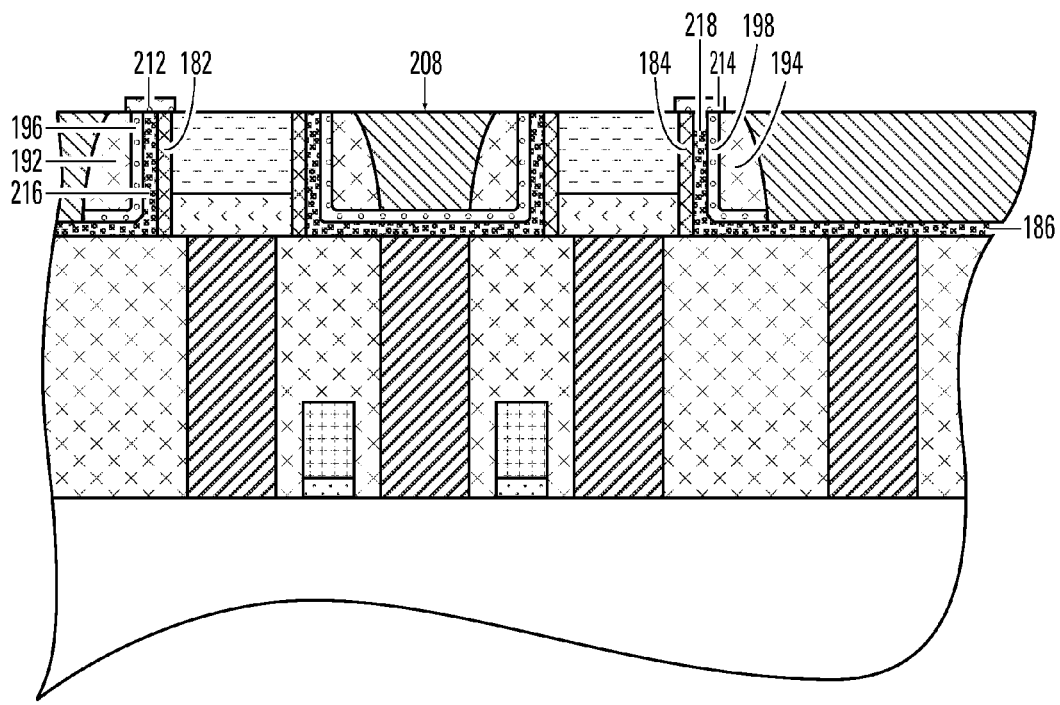

FIG. 10A is a cross section of the portion of the integrated circuit of FIG. 9 after a thin film layer of memory material, such as GST, or other suitable programmable resistive material, has been deposited and patterned to form bridges 212, 214 of memory material (compare, FIG. 1A, ref num. 102). An optional layer of protective material (not shown) such as low temperature deposited SiN, over the GST is formed to protect the GST from subsequent processing steps. The layer of GST is deposited for example by sputtering without collimation at about 250° C., or other deposition technique, after a step to pre-clean top surfaces of the electrode structures. It is desirable that the GST layer be formed as thin as practical for the purpose of limiting the magnitude of the reset current needed for changing the phase of the material.

Bridge 212 connects the first electrode 182 with the second electrode ("L-shaped electrode") 196 across the sidewall spacer insulating member 216 (see FIG. 1A, ref num. 108) formed from the first sidewall spacer layer 186. Similarly, bridge 214 connects electrodes 184, 198 across a sidewall spacer insulating member 218 formed from the first sidewall spacer layer 186. The bridge 212 extends onto the portion (see FIG. 9, ref num. 210) of the planarized surface 208 formed by the third sidewall spacer 192, and bridge 214 extends onto the portion of the planarized surface formed by the third sidewall spacer 194.

The bridge thickness $T_B$ (see FIG. 1B) can be very small in embodiments of the memory cell, and the length of the active region can also be very short, according to the thickness of the sidewall spacer insulating member 218. This bridge thickness $T_B$ can be established using a thin film deposition technique on the top surfaces of the first electrode, sidewall insulating member, and second electrode. Thus, embodiments of the memory cell have a bridge thickness $T_B$ about 50 nm or less. Other embodiments of the memory cell have a bridge thickness of about 20 nm or less. In yet other embodiments, the bridge thickness $T_B$ is about 10 nm or less. It will be understood that the bridge thickness $T_B$ can be even smaller than 10 nm, using thin film deposition techniques such as atomic layer deposition and the like, according to the chosen memory materials and the needs of the particular application, so long as the thickness is sufficient for the bridge to perform its purpose as memory element which, for a phase change material, requires a bridge member having an active region having at least two solid phases, reversible by a current or by a voltage applied across the first and second electrodes.

A thin bridge (i.e. small $T_B$) is desirable to provide small contact areas between the bridge and the electrodes. This helps confine heat generated during a programming or reset operation to the bridge material because electrode materials typically have relatively high thermal conductivity, and larger contact areas would conduct more heat out of the bridge. In an embodiment having a bridge width of 50 nm and an electrode length of 30 nm, a contact area of about 1,500 nm$^2$ is formed. Other embodiments have smaller contact areas.

Figure 10B:
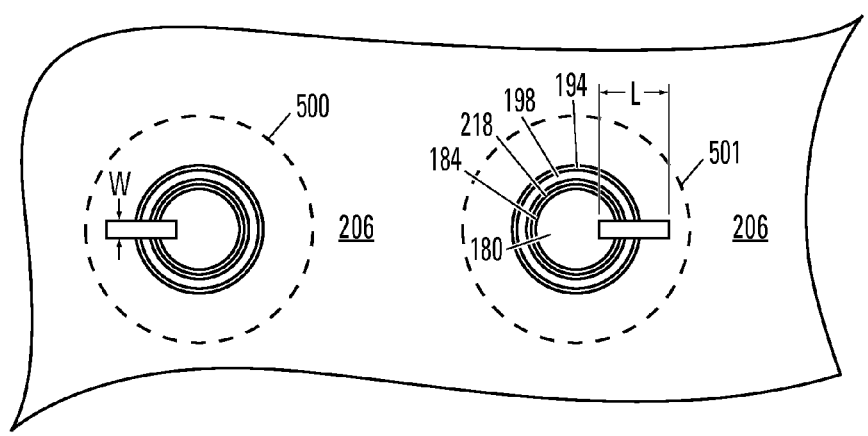

FIG. 10B is a plan view of the surface portion of the integrated circuit of FIG. 10A showing the sidewall support structure 180, first electrode 184, sidewall spacer insulating member 218, second electrode 198 and planarized portion of the third sidewall spacer 194 surrounded by the field of the IMD layer 206. The dashed circles 500, 501 indicate the perimeters of the radially extending horizontal portions of the L-shaped electrode members, formed without lithographic steps. The bridges 212, 214 have a bridge width W that, like the bridge thickness $T_B$, is also very small to reduce the volume of the active region (see FIG. 1B, ref num. 124), and hence reduce the electronic energy used to program and reset the memory cells. This bridge width W is implemented in preferred embodiments, so that it has a width less than 50 nm. In some embodiments, the bridge width W is about 40 nm or less. The bridge length L is sufficient to electrically couple the first electrode 184 to the second electrode 198 across the sidewall spacer insulating member 218, and is between about 30 nm and about 100 nm, preferably about 50 nm, in some embodiments. In some embodiments, the bridge width is patterned using a photoresist ashing technique to reduce the bridge width, which can provide a width less than the minimum photolithographic feature size.

Figure 11:
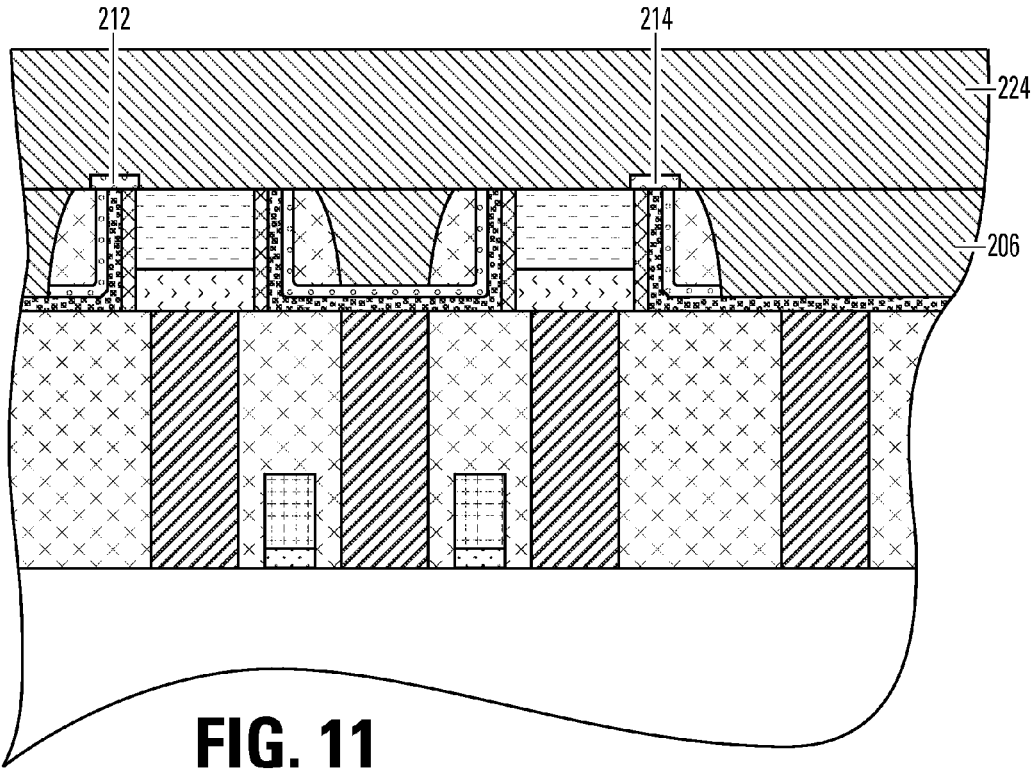

FIG. 11 is a cross section of the portion of the integrated circuit of FIG. 10A with a dielectric fill layer 224 overlying the thin film memory material bridges 212, 214 and IMD layer 206. After depositing the dielectric fill layer material, the material is planarized using CMP or another process to provide a planar surface for subsequent photolithographic processing. In a particular embodiment, the dielectric fill layer 224 comprises one or more of silicon dioxide, a polyimide, silicon nitride or other dielectric fill material. The IMD layer 206 similarly comprises silicon dioxide, a polyimide, silicon nitride or other dielectric fill material, and may comprise the same dielectric material(s) as the dielectric fill layer 224, or a different dielectric material(s). In embodiments, the dielectric fill layer 224 comprises a relatively good insulator for heat as well as for electricity, providing thermal and electrical isolation for the bridges 212, 214.

Figure 12:
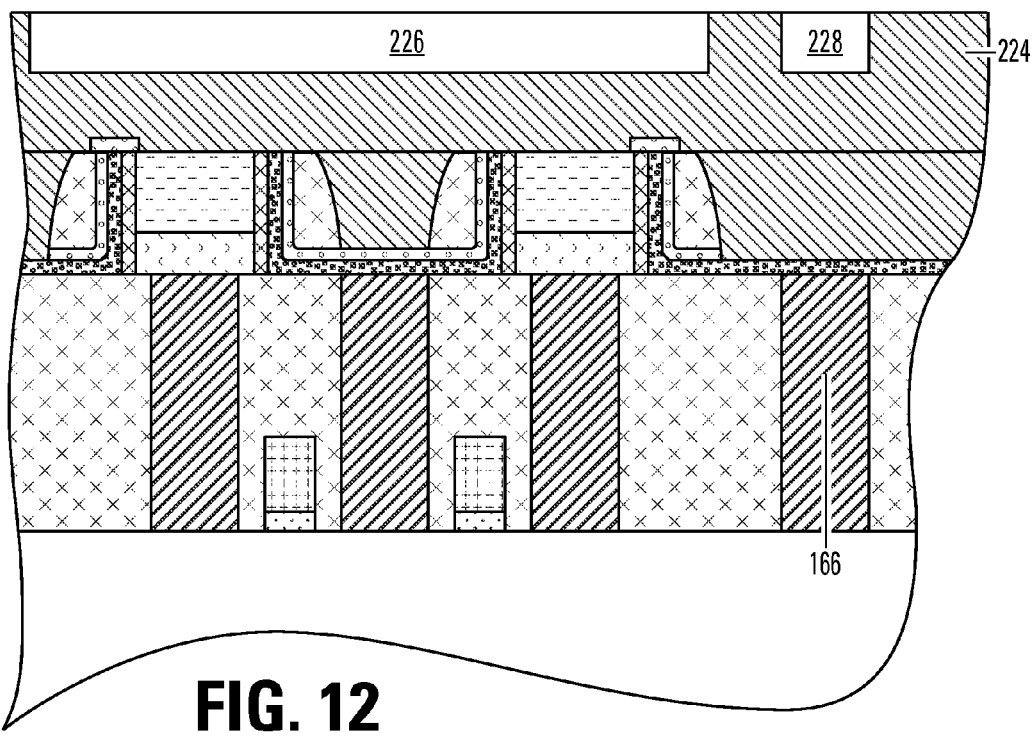

FIG. 12 is a cross section of the portion of the integrated circuit of FIG. 11 with trenches 226, 228 formed in the dielectric fill layer 224 using conventional photolithographic and etch techniques. The trenches will be filled with metal in later steps, as is well known in the art of damascene and dual damascene metallization techniques.

Figure 13:
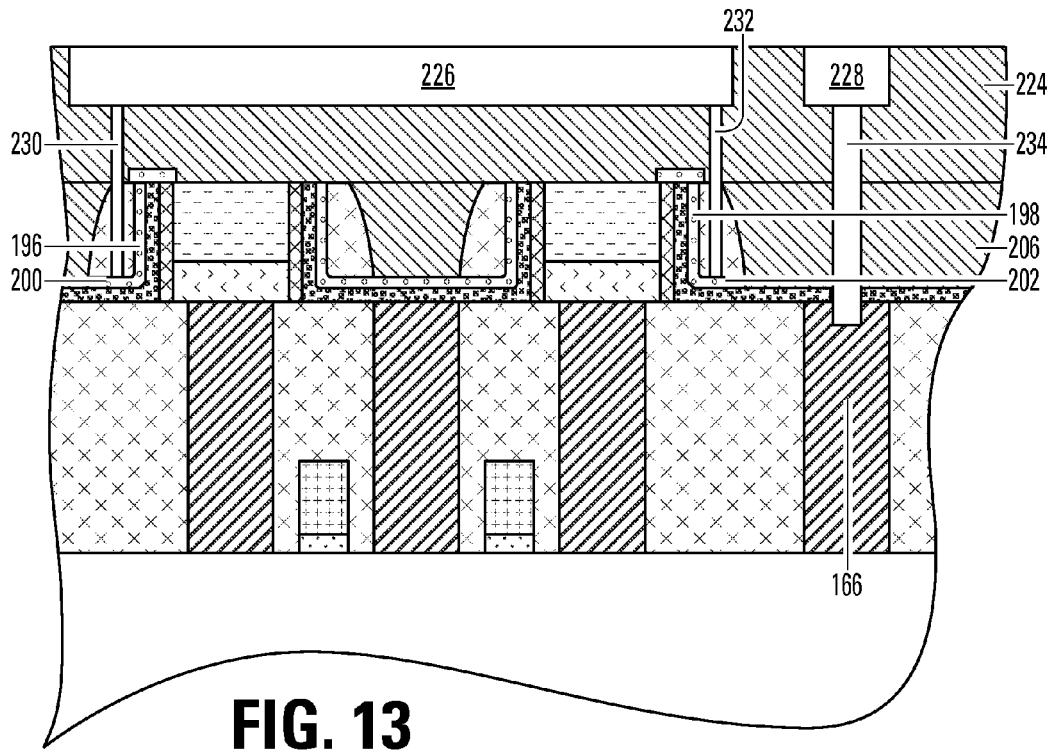

FIG. 13 is a cross section of the portion of the integrated circuit of FIG. 12 with vias 230, 232, 234 extending from the trenches 226, 228 through the dielectric fill layer 224 and the IMD layer 206 to the second electrodes 196, 198 and to the peripheral conductive plug 166, which in a particular embodiment is a tungsten plug. The etch technique used to form the vias selectively etches the material(s) of the dielectric layers without substantially etching the material of the second sidewall spacer layer (see FIG. 6, ref num. 188), which is relatively thin compared to the conductive plug 166. The vias 230, 232 extend to the horizontal portions 200, 202 of the L-shaped electrodes 196, 198. The third sidewall spacer (see FIG. 7, ref nos. 192, 194) provide a self-aligning etch mask to form the L-shaped electrodes. In an alternative embodiment, the third sidewall spacers are removed after the L-shaped electrodes have been defined to provide the horizontal portions, or other techniques are used to define the horizontal portions of the L-shaped electrodes.

Figure 14:
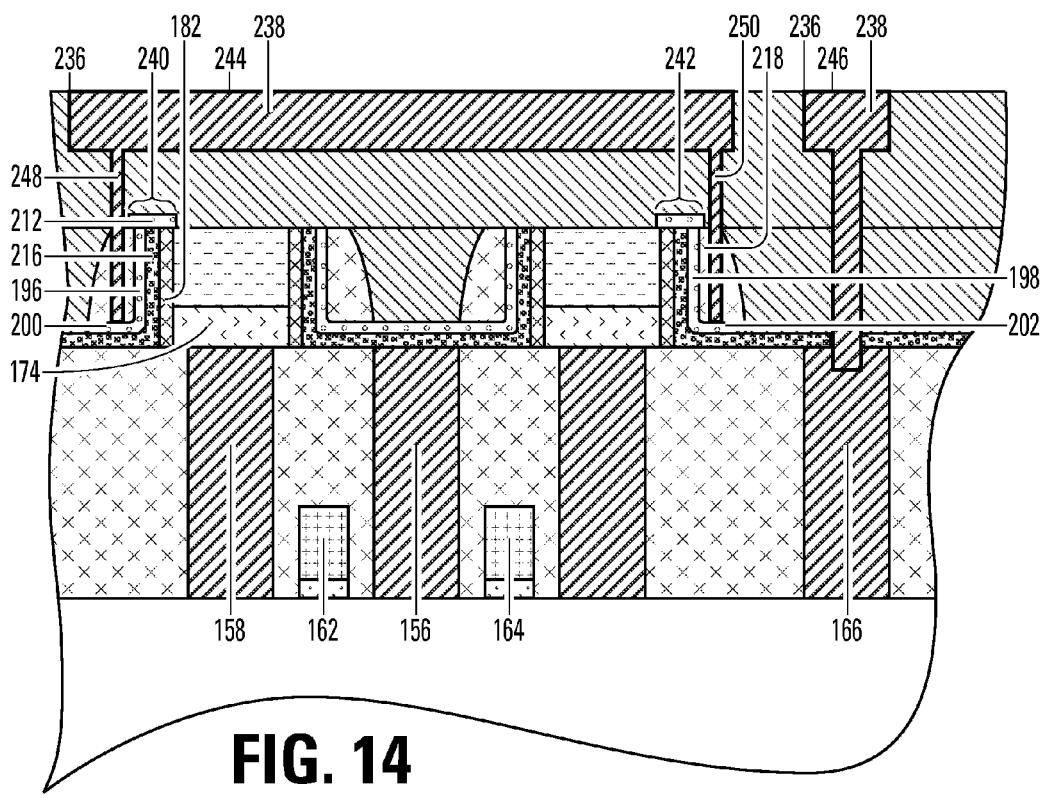

FIG. 14 is a cross section of the portion of the integrated circuit of FIG. 13 after metal patterning. In a particular embodiment, a barrier layer 236 is deposited in the trenches and vias (see FIG. 13, ref nos. 226, 228, 230, 232, 234), then copper 238 is deposited, and the wafer is CMP'd, as is well known in the art of dual damascene processing. Contact plugs 248, 250 provide a path for current from the horizontal portions 200, 202 of the L-shaped electrodes 196, 198 to bit lines in the metallization layer, which are in turn coupled to decoding and sensing circuits. Other metallization techniques, such as single damascene, tungsten plug, and thin film metallization techniques, including patterned metal layers formed prior to depositing the dielectric fill layer, and other metals or other conductors are alternatively used.

Two memory cells 240, 242, corresponding to the thin film bridges of memory material, are shown in this portion of the IC. In operation, the memory cells 240, 242 are accessed by applying a control signal to a bit line 244 formed in the patterned conductive layer. Another control signal is applied to a selected word line, such as a word line that is connected to the gate 162 of the transistor (see FIG. 2A, ref num. 152) associated with memory cell 240. Thus, individual memory cells (e.g. memory cell 240) are accessed by controlling their associated bit lines and word lines. Memory cells are programmed, read, and reset by applying appropriate signals to their bit lines and word lines, as is well known in the art of electronic memory operation. Other conductive structures, such as peripheral contact 246, contact other electronic terminals of the IC, such as peripheral contact 166.

In operation, access to the memory cell 240 is accomplished by applying a control signal to the word line connected to the gate 162, which couples the common source contact 156 to the drain contact 158, and hence to the conductor portion 174, electrode 182, and the bridge 212 of memory material, electrode 196 to the bit line 244. In other words, the bridge 212 provides a current path between the first and second electrodes 182, 196. Likewise, access to the memory cell 242 is accomplished by applying a control signal to the word line associated with gate 164.

It will be understood that a wide variety of materials can be utilized in implementation of the patterned metal layer in FIG. 14. Other types of metallization, including aluminum, titanium nitride, and tungsten based materials can be utilized as well. Also, non-metal conductive material, such as doped polysilicon, can be used. The electrode material in the illustrated embodiment is preferably TiN or TaN. Alternatively, the electrodes are TiAlN or TaAlN, or comprise, for further examples, one or more elements selected from the group consisting of Ti, W, Mo, Al, Ta, Cu, Pt, Ir, La, Ni, and Ru and alloys thereof. The sidewall spacer insulating members 216, 218 may comprise silicon oxide, silicon oxynitride, silicon nitride, $Al_2O_3$, or other low-K dielectrics. Alternatively, the sidewall spacer insulating members may comprise one or more elements selected from the group consisting of Si, Ti, Al, Ta, N, O, and C.

In a particular embodiment, the active region (see FIG. 1B, ref num. 124) of a memory cell has a volume less than or equal to the bridge thickness $T_B$, times the bridge width W, times the sidewall insulating member length (see FIG. 1A, ref num. 109). For an embodiment having a bridge thickness of 50 nm, a bridge width of 50 nm, and a sidewall insulating member length of 30 nm, the bridge in a memory cell has a volume of about 75,000 $nm^3$. In another embodiment having a bridge thickness of 10 nm, a bridge width of 40 nm, and a sidewall insulating member length of 20 nm, the active region of a bridge in a memory cell is confined within a region having a volume of about 8,000 $nm^3$.

Figure 15:
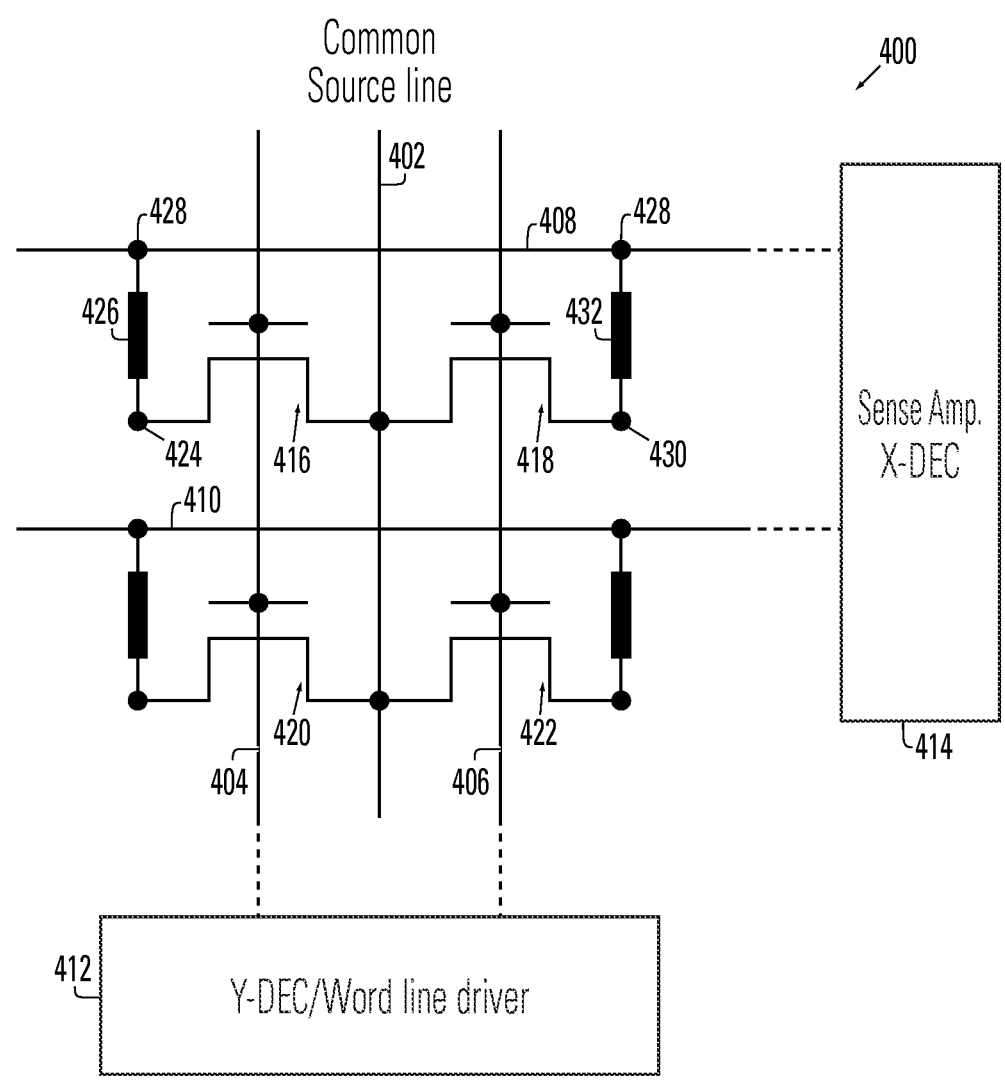
FIG. 15 is a schematic diagram for a memory array comprising phase change memory elements according to an embodiment.

FIG. 15 is a schematic illustration of a memory array 400, which can be implemented using memory cells as described with reference to FIGS. 1A and 14, or with other memory cells according to embodiments. In the schematic illustration of FIG. 15, the common source line 402, the word line 404 and the word line 406 are arranged generally parallel in the y-direction. Bit lines 408, 410 are arranged generally parallel in the x-direction. Thus, a y-decoder and a word line driver in block 412 are coupled to the word lines 404, 406. An x-decoder and set of sense amplifiers in block 414 are coupled to the bit lines 408, 410. The common source line 402 is coupled to the source terminals of access transistors 416, 418, 420, 422. The gate of access transistor 416 is coupled to the word line 404. The gate of access transistor 418 is coupled to the word line 406. The gate of access transistor 420 is coupled to the word line 404. The gate of access transistor 422 is coupled to the word line 406. The drain of access transistor 416 is coupled to the electrode member 424 for memory cell 426, which is in turn coupled to electrode member 478. Likewise, the drain of access transistor 418 is coupled to the electrode member 430 for memory cell 432, which is in turn coupled to the electrode member 428. Memory cells 426, 432 have bridges of memory material with reduced electrode contact areas and a reduced active region length provided by sidewall layers, and an L-shaped electrode having a horizontal portion.

The electrode members 428, 478 are coupled to the bit line 408. Access transistors 420, 422 are coupled to corresponding memory cells as well on line 410. It can be seen that the common source line 402 is shared by two rows of memory cells, where a row is arranged in the y-direction in the illustrated schematic.

Figure 16:
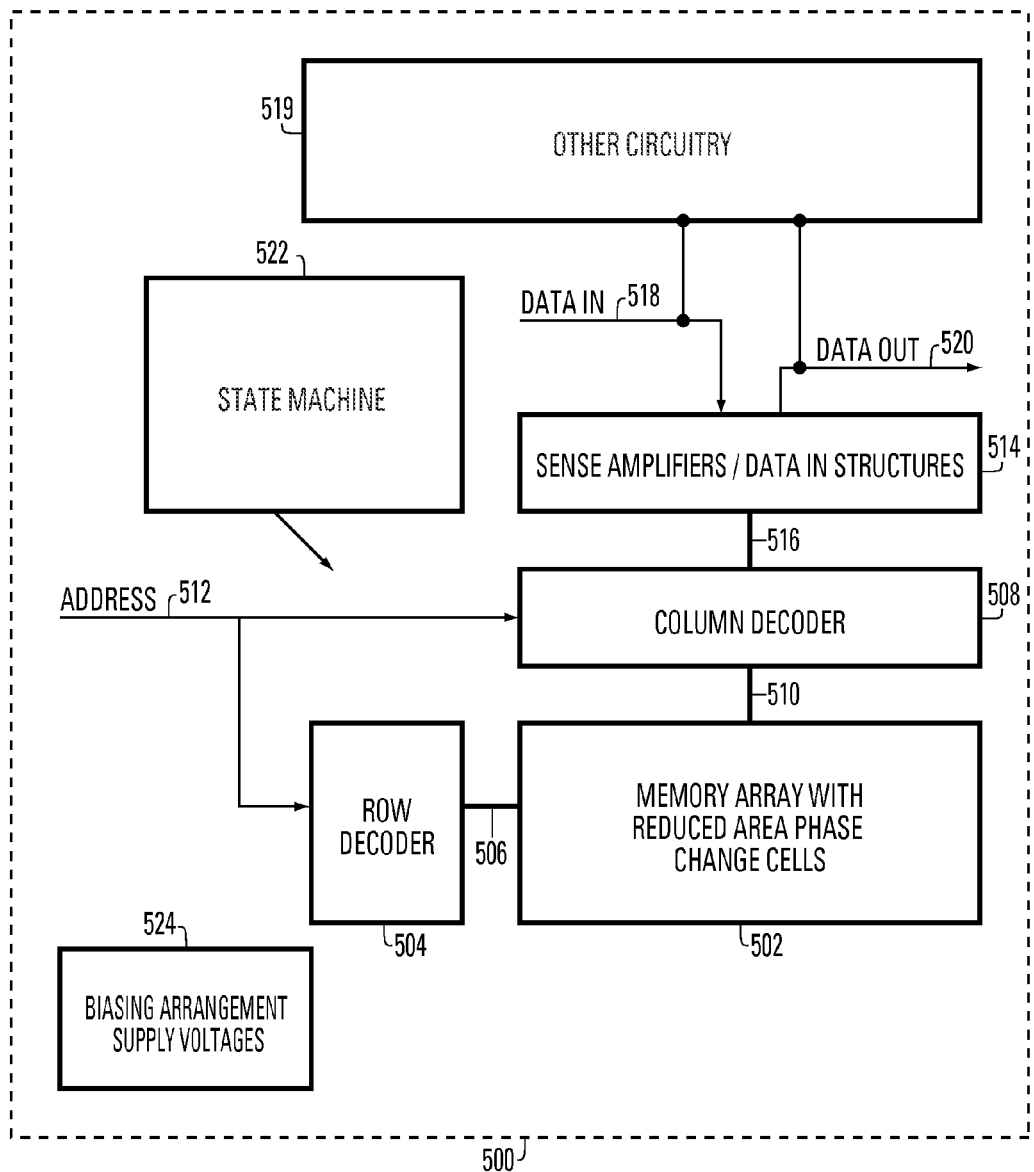
FIG. 16 is a block diagram of an integrated circuit device including a phase change memory array according to an embodiment.

FIG. 16 is a simplified block diagram of an integrated circuit 500 according to an embodiment of the present invention. The integrated circuit 500 includes a memory array 502 implemented using thin film fuse phase change memory cells having reduced electrode contact areas, a reduced active region length, and an L-shaped electrode on a semiconductor substrate. A row decoder 504 is coupled to a plurality of word lines 506, and arranged along rows in the memory array 502. A column decoder 508 is coupled to a plurality of bit lines 510 arranged along columns in the memory array 502 for reading and programming data from the phase change memory cells in the memory array 502. Addresses are supplied on bus 512 to column decoder 508 and row decoder 504. Sense amplifiers and data-in structures in block 514 are coupled to the column decoder 508 via data bus 516. Data is supplied via the data-in line 518 from input/output ports on the integrated circuit 500 or from other data sources internal (e.g. other circuitry 519) or external to the integrated circuit 500, to the data-in structures in block 514. In the illustrated embodiment, other circuitry 519 is included on the integrated circuit, such as a general purpose processor or special purpose application circuitry, or a combination of modules providing system-on-a-chip functionality supported by the thin film fuse phase change memory cell array. Data is supplied via the data-out line 520 from the sense amplifiers in block 514 to input/output ports on the integrated circuit 500, or to other data destinations internal or external to the integrated circuit 500.

A controller implemented in this example using bias arrangement state machine 522 controls the application of bias arrangement supply voltages 524, such as read, program, erase, erase verify and program verify voltages. The controller can be implemented using special purpose logic circuitry as known in the art. In alternative embodiments, the controller comprises a general purpose processor, which may be implemented on the same integrated circuit, which executes a computer program to control the operations of the device. In yet other embodiments, a combination of special purpose logic circuitry and a general purpose processor may be utilized for implementation of the controller.

Advantages of an embodiment described herein include reduced electrode contact areas, which results in less heat being drawn away from the active region during programming and resetting operations because the electrically conductive material of the electrodes is also usually a relatively good thermal conductor, and a reduced active region length, which concentrates the heat generated during programming and resetting operations in a smaller volume, providing improved reliability and lower set/reset power levels.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

What is claimed is:

1. A method for manufacturing a memory device, comprising:
   forming a sidewall support structure having a sidewall;
   depositing a first electrode layer on the sidewall;
   forming a first electrode from the first electrode layer;
   depositing an insulating sidewall spacer layer over the first electrode;
   depositing a conductive sidewall spacer layer on the insulating sidewall spacer layer;
   depositing a third sidewall spacer layer on the conductive sidewall spacer layer;
   forming a third sidewall spacer from the third sidewall spacer layer and a second electrode from the conductive sidewall spacer layer, the second electrode having a horizontal portion underlying the third sidewall spacer;
   applying a dielectric fill material to form a bridge surface including a top surface of the first electrode, a top surface of the insulating sidewall spacer layer, and a top surface of the second electrode; and
   forming a bridge of memory material between the first electrode and the second electrode on the bridge surface across the top surface of the insulating sidewall spacer layer, the bridge comprising a patch of memory material contacting the top surface of the first electrode and the top surface of the second electrode to define an inter-electrode path between the first electrode and second electrode having a path length defined by a thickness of the insulating sidewall spacer layer.

2. The method of claim 1, wherein said applying a dielectric fill includes:
   depositing a layer of dielectric material over the memory device; and
   planarizing the layer of dielectric material whereby the bridge surface is planarized.

3. The method of claim 2, wherein planarizing further includes forming a planarized top surface of the third sidewall spacer.

4. The method of claim 1, wherein the horizontal portion has a length less than about 300 nm.

5. The method of claim 1, comprising
   forming a contact plug connected to the horizontal portion of the second electrode, and wherein the horizontal portion has a length sufficient for connection to the contact plug plus alignment tolerances for a manufacturing technique used to form the contact plug.

6. The method of claim 1 wherein forming the sidewall support structure comprises forming a layer of conductive material, forming a layer of insulating material over the conductive material, patterning the layer of insulating material to form the sidewall support structure, and using the sidewall support structure to pattern the layer of conductive material to form conductive portions.

7. The method of claim 1, wherein the thickness of the conductive sidewall spacer layer is between 0.5 nm and 30 nm.

8. The method of claim 1 further comprising
   forming a via through the third sidewall spacer and
   filling the via with conductive material so as to form a contact plug connected to the horizontal portion of the second electrode.

9. The method of claim 1, wherein the third sidewall spacer is an insulating sidewall spacer and the surface further includes a top surface of the insulating sidewall spacer, and wherein a portion of the bridge overlies a portion of the top surface of the insulating sidewall spacer.

10. An integrated circuit including a memory array having a memory device manufactured according to claim 1.

11. The integrated circuit of claim 10, further including an array of memory devices and a corresponding array of access transistors, wherein the integrated circuit includes a plurality of word lines and isolation devices controlled by signals on the plurality of word lines, and a plurality of bit lines.

12. The integrated circuit of claim 10 further including complementary metal-oxide-semiconductor ("CMOS") circuitry.

13. The method of claim 1, wherein the memory material comprises a combination of Ge, Sb, and Te.

14. The method of claim 1, wherein the memory material comprises a combination of two or more materials from the group of Ge, Sb, Te, Se, In, Ti, Ga, Bi, Sn, Cu, Pd, Pb, Ag, S, and Au.

15. A method for manufacturing a memory device, comprising:
   forming an insulating structure;
   forming a first electrode surrounding the insulating structure;
   forming an insulating layer beside the first electrode;
   forming a second electrode beside the insulating layer and concentric with the first electrode, wherein the second electrode has a first part and a second part, and an angle is between the first and second parts; and
   forming a memory material over and electrically coupled to the first and second electrodes.

16. The method of claim 15, wherein there is a ring-shape surface of the first electrode.

17. The method of claim 15, wherein there is a ring-shape surface of the second electrode.

* * * * *